United States Patent
Hill et al.

(10) Patent No.: US 7,176,114 B2
(45) Date of Patent: Feb. 13, 2007

(54) METHOD OF DEPOSITING PATTERNED FILMS OF MATERIALS USING A POSITIVE IMAGING PROCESS

(75) Inventors: Ross H. Hill, Coquitlam (CA); Sharon Louise Blair, Coquitlam (CA); Grace Li, Coquitlam (CA); Xin Zhang, Burnaby (CA); Haixiong Ruan, Burnaby (CA)

(73) Assignee: Simon Fraser University, Burnaby (CA)

( * ) Notice: Subject to any disclaimer, the term of this patent is extended or adjusted under 35 U.S.C. 154(b) by 39 days.

(21) Appl. No.: 10/630,301

(22) Filed: Jul. 30, 2003

(65) Prior Publication Data

US 2004/0126711 A1 Jul. 1, 2004

Related U.S. Application Data

(63) Continuation-in-part of application No. 09/874,330, filed on Jun. 6, 2001, now Pat. No. 6,696,363.

(60) Provisional application No. 60/209,947, filed on Jun. 6, 2000.

(51) Int. Cl.
*H01L 21/22* (2006.01)
*H01L 21/38* (2006.01)
*G03F 7/26* (2006.01)

(52) U.S. Cl. ............................ 438/553; 257/E21.023; 433/315

(58) Field of Classification Search ................ 438/553, 438/681
See application file for complete search history.

(56) References Cited

U.S. PATENT DOCUMENTS

| 4,770,590 A | 9/1988 | Hughes et al. ............. 414/172 |
|---|---|---|
| 5,140,366 A | 8/1992 | Shiozawa et al. ............ 355/53 |
| 5,178,989 A | 1/1993 | Heller et al. ................ 430/323 |
| 5,272,099 A | 12/1993 | Chou et al. ................... 437/41 |
| 5,292,558 A | 3/1994 | Heller et al. .................. 216/13 |
| 5,436,176 A | 7/1995 | Shimizu et al. ............... 606/71 |
| 5,470,693 A * | 11/1995 | Sachdev et al. ............ 430/315 |
| 5,534,312 A | 7/1996 | Hill et al. ................... 427/533 |
| 5,627,087 A | 5/1997 | Hsu et al. ................... 438/302 |
| 5,652,166 A | 7/1997 | Sun et al. ..................... 437/56 |

(Continued)

*Primary Examiner*—W. David Coleman
(74) *Attorney, Agent, or Firm*—Morgan, Lewis & Bockius, LLP

(57) ABSTRACT

The invention generally encompasses a method for forming a pattern on a substrate. The method comprises applying a precursor comprising at least one metal to a substrate to form a precursor layer, exposing a predetermined portion of the precursor layer and developing the predetermined portion of the precursor layer. The developing step removes, or at least substantially removes, the predetermined portion from the substrate, thereby forming a pattern on the substrate that comprises a remaining portion of the precursor. In one embodiment, the precursor layer comprises $Ti(Pr^iO)_2$ $(EAA)_2$.

43 Claims, 2 Drawing Sheets

U.S. PATENT DOCUMENTS

| | | | |
|---|---|---|---|
| 5,716,758 A | 2/1998 | Bae et al. | 430/312 |
| 5,849,465 A * | 12/1998 | Uchida et al. | 430/325 |
| 5,935,762 A | 8/1999 | Dai et al. | 430/312 |
| 5,989,759 A | 11/1999 | Ando et al. | 430/22 |
| 6,072,207 A | 6/2000 | Yoshimori et al. | 257/295 |
| 6,307,087 B1 | 10/2001 | Buchwald et al. | 558/388 |
| 6,348,239 B1 * | 2/2002 | Hill et al. | 427/533 |
| 6,387,012 B1 | 5/2002 | Mitamura | 427/100 |
| 6,458,431 B2 * | 10/2002 | Hill et al. | 427/537 |
| 6,723,388 B2 * | 4/2004 | Svendsen et al. | 427/526 |
| 6,723,486 B2 * | 4/2004 | Wallow et al. | 430/270.1 |
| 6,787,198 B2 * | 9/2004 | Mukherjee et al. | 427/526 |
| 6,790,579 B1 * | 9/2004 | Goodall et al. | 430/170 |
| 2002/0076495 A1 * | 6/2002 | Maloney et al. | 427/272 |
| 2003/0073042 A1 * | 4/2003 | Cernigliaro et al. | 430/321 |
| 2004/0087690 A1 * | 5/2004 | Lamanna et al. | 524/155 |
| 2005/0285312 A1 * | 12/2005 | Fury et al. | 264/401 |

* cited by examiner

METHOD OF DEPOSITING PATTERNED FILMS OF MATERIALS USING A POSITIVE IMAGING PROCESS

This application is a continuation-in-part of U.S. patent application Ser. No. 09/874,330, filed Jun. 6, 2001, now U.S. Pat. No. 6,696,363, which claims the benefit of U.S. Provisional Application No. 60/209,947, filed Jun. 6, 2000. The content of these applications are hereby incorporated herein in their entirety by reference.

BACKGROUND OF THE INVENTION

1. Field of the Invention

This invention relates to methods for producing patterned films of metal-containing materials on a substrate. More particularly, the methods of the present invention relate to a positive metal organic deposition process for producing patterned films of metal-containing compounds on a substrate through photochemical reactions, photothermal reactions or a combination thereof.

2. Description of the Related Art

The semiconductor and packaging industries, among others, utilize thin metal and metal-oxide films in their products. Examples of conventional processes used to form such thin metal and metal-oxide films include evaporation, sputter deposition or sputtering, chemical vapor deposition ("CVD") and thermal oxidation.

Evaporation is a process whereby a material to be deposited is heated near a substrate on which deposition is desired. The process is normally conducted under vacuum conditions and comprises vaporizing the material to be deposited and condensing that material on the substrate. A screen or shadow can be used to pattern a film of the desired material on the substrate. Unfortunately, evaporation has several disadvantages such as the need for high temperatures and high vacuum conditions.

Sputtering is a process similar to evaporation and comprises vaporizing a material to be deposited on a substrate by bombarding the material with incident atoms of sufficient kinetic energy such that particles of the material are dislodged into the vapor phase and condensing the vaporized material onto the substrate. Sputtering not only suffers from the same disadvantages as evaporation but also requires additional consumables and equipment capable of generating the incident atoms.

The CVD process is similar to evaporation and sputtering but is distinguishable in that the deposited material undergoes a chemical reaction prior to deposition on a substrate. As with evaporation and sputtering, the CVD method requires high temperatures. Furthermore, although CVD can be performed at atmospheric as well as low pressures, the need for sophisticated equipment increases the cost of the process.

Thermal oxidation uses an oxygen atmosphere to oxidize an unpatterned layer of film previously deposited on a substrate in an unoxidized state. Unfortunately, like the processes above, thermal oxidation also requires the use of high temperatures.

Other methods, such as sol-gel and spin-on methods, include applying a precursor solution to a substrate to form a desired metal or metal-oxide film. Spin-coating or spin-casting may be used to apply the precursor solution and comprises dropping the precursor solution onto the middle of the substrate while it is rotated around its axis. The coated substrate is heated to a high temperature to convert the precursor film into a film of the desired material. The advantage of such methods over vapor-phase deposition is that the equipment requirements are less stringent. However, high temperatures are still required, as well as additional patterning steps, to obtain a pattern of the desired material.

In another method of forming patterned films, a photosensitive film is applied to a substrate and patterned. A conformal blanket of the desired material is then deposited on top of the patterned photosensitive material. A treatment that attacks the photosensitive material is applied to lift off both the photosensitive material and the attached overlying portion of the conformal blanket of desired material, thus leaving a patterned film of the desired material on the substrate. An advantage of this process is that an etching step is not required. Disadvantages include the fact that the process requires the additional steps of applying and patterning the photosensitive film. Further, pattern resolution is limited, which seriously hinders the usefulness of this method, since increasingly small features are becoming critical to modern applications.

In another method of forming patterned films, a conformal blanket of desired material is deposited over a channel that has been patterned into a substrate. The desired material fills and takes on the pattern of the channel, and the portion of the desired material outside the channel is removed, for example, by a process such as etching. A commonly used etching process is chemical mechanical planarization ("CMP"), which comprises applying a chemical agent with a slurry of abrasive particles to remove the desired material outside of the channel through a combination of chemical and mechanical action. Unfortunately, CMP requires expensive and complicated planarization equipment; extra consumable materials such as planarization pads, slurries and chemical agents; and extra processing steps to remove contaminants introduced by the process such as small slurry particles and etching chemicals.

Direct imaging methods have been used to pattern photoresist films. Photoresist is a lithographic material applied to the surface of a desired material as a step in existing patterning processes. The photoresist may be applied conventionally by spin coating, other solution-based coating methods, or by application of a dry film. Light is applied to the photoresist through a mask to form a predetermined pattern. The pattern formation occurs when the light changes the solubility of the exposed areas of the photoresist, and this change in solubility allows for the design of a selective development process. The undeveloped portion of the photoresist is then used as a pattern transfer medium or mask for etching the desired pattern into the desired material. The photoresist mask and any etch residues are then removed, and a patterned film of material remains on the substrate.

Negative direct imaging has also been applied to the deposition of metal-containing materials. This process comprises dissolving a metal organic complex in a suitable organic solvent to form a precursor solution. The precursor solution is then deposited on a substrate to form a film, and select portions are exposed to energy through, for example, use of a mask. The unexposed portions are then removed with a developer. Examples of such processes can be found in U.S. Pat. Nos. 5,534,312; and 6,071,676; and U.S. Patent Application Pub. No. U.S. 2002/0160103 A1, each of which are hereby incorporated herein in their entirety by reference.

One disadvantage of depositing metal-containing materials with negative direct imaging is that the materials used to form patterned films of metal-containing materials are limited to those that are soluble in a developer and that convert upon exposure to energy to a material that is insoluble in the developer. The problem is that some materials that adequately convert to an insoluble material upon exposure to energy are not very soluble in the developer in their unexposed form. As a result, harsh solvents are necessary to remove them, and these harsh solvents do not selectively develop only the unexposed portion of the film, but rather, they attack the converted material as well, thereby degrading the quality of the desired pattern to be formed.

Another disadvantage of negative direct imaging methods is that the amount of conversion is non-uniform. The energy scattering and attenuation that occurs during exposure of the metal-containing material may create a gradient in the degree of exposure across the thickness of the material, which accordingly results in a gradient in the degree of conversion of the material. As such, negative direct imaging creates a gradual change in the structure of the material across its thickness. This gradual change in structure creates differences in performance characteristics among the patterned metal-containing materials successively produced by the negative direct imaging method.

Accordingly, there is a need for a method of depositing metal-containing materials that is more cost effective, produces a more uniform product, and is capable of depositing a wider range of precursor materials.

SUMMARY OF THE INVENTION

The invention generally encompasses a method for forming a pattern on a substrate. The method comprises applying a precursor comprising at least one metal to a substrate to form a precursor layer, exposing a predetermined portion of the precursor layer and developing the predetermined portion of the precursor layer. The developing step removes the predetermined portion from the substrate and forms a pattern on the substrate that comprises a remaining portion of the precursor. In one embodiment, the precursor layer comprises $Ti(Pr^iO)_2(EAA)_2$.

The current invention provides a process for forming patterned metal or metal-oxide films on a substrate and is particularly useful in forming patterned metal or metal-oxide films used in microelectronics. The discovery that the solubility of metal-containing materials can increase after exposure to an energy source was unexpected and surprising in that such an increase in solubility is counter-intuitive to the formation of extended-solid/extended-oxide compounds. One of skill in the art would expect the metal-containing materials of the present invention to form a less-soluble extended-solid/extended-oxide compounds when exposed to energy in the manner disclosed herein.

This unexpected and surprising discovery provides many benefits over prior art methods. One benefit is a reduction in the time and expense associated with the need for additional process steps such as, inter alia, high temperature processing, CMP removal of excess material, photoresist patterning, plasma etching, and the cleaning and rinse steps necessary with each additional step. As such, there is a reduction in the cost of equipment, use of energy, other consumables, and processing time. Another benefit is a reduction in cost and storage requirements since the additional chemicals required by prior art methods are no longer necessary. Another benefit is improved product performance due to a more uniform pattern of desired material.

The present invention takes advantage of the benefits of positive photoresist lithography. In a positive lithography system, the regions converted by exposure to energy are removed with a developer. As such, patterned films are produced that do not suffer from the adverse effects of photochemical and photothermal conversion. Positive lithography generally removes converted material, whereas negative lithography generally retains converted material and thus retains any adverse effects created by the process. One benefit is a lower occurrence of defects produced by the lithographic process, since defects present in the exposed and, thus, developed regions of the metal-containing material are removed. Another benefit is that the remaining patterned film is uniform throughout its thickness, whereas an exposed film will normally be non-uniform across its thickness due to unequal exposure. Another benefit is that the patterned film does not suffer from the effects of shrinkage that would otherwise result from photolysis. Another benefit is that the temperatures used in producing the patterned film can be below the glass-transition temperature of most desired substrates. As such, many of the benefits of positive lithography are due to increases in uniformity.

DETAILED DESCRIPTION OF THE PREFERRED EMBODIMENTS

As discussed in more detail below, the invention generally encompasses a method for forming a pattern on a substrate. The method comprises applying a precursor comprising at least one metal to a substrate to form a precursor layer, exposing a predetermined portion of the precursor layer and developing the predetermined portion of the precursor layer. The developing step removes, or at least substantially removes, the predetermined portion from the substrate, thereby forming a pattern on the substrate that comprises a remaining portion of the precursor. The following description, in conjunction with the accompanying Figures, describes several preferred embodiments of the present invention.

Figure 1:
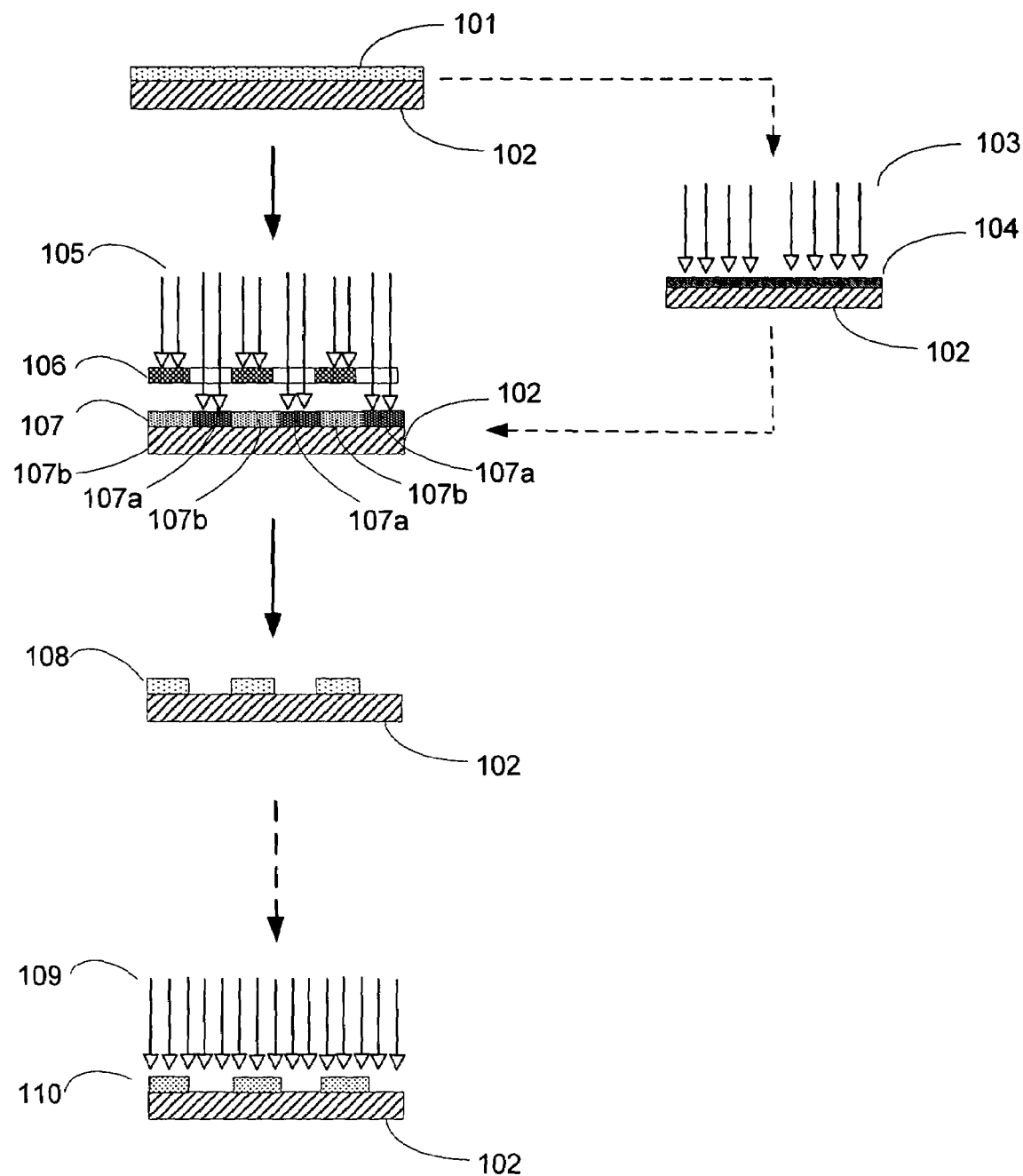
FIG. 1 illustrates a process for forming a patterned film of metal-containing material on a substrate according to one embodiment of the present invention.

FIG. 1 illustrates the process of forming a patterned film of metal-containing material on a substrate according to one embodiment of the present invention. In a first step, a precursor comprising at least one metal is applied to a substrate 102 to form a precursor layer 101. Generally, the precursor is selected based upon the desired end use of the final patterned film or to provide a desired property to the film such as conductivity, oxidation rate, crazing, shrinkage, densification, and thickness.

The precursor is also selected based upon its solubility characteristics. The precursor should be capable of being developed or solubilized in a developer after exposure to energy. In other words, the precursor, after being exposed to energy, should be generally soluble in a developer so that it can be removed from a substrate. In addition, the unexposed precursor must be generally insoluble in the same developer. It should be appreciated that different precursors will have varying degrees of solubility after exposure to energy in the developer; however, the higher the solubility, the more desirable the precursor. Similarly, unexposed precursors will have varying degrees of insolubility in the developer and the less soluble, the more desirable the precursor. As will be discussed below, the selection of developer will also affect the solubility of the precursor in that developer.

As noted, the precursor comprises at least one metal, which is preferably bound to at least one ligand. The metal in the precursor may be any metal, metalloid, compound of a metal or metalloid including oxides, sulfides, ceramics, alloys, organometallics and coordination compounds.

Examples of the metals encompassed by the present invention include, for example, Li, Na, K, Rb, Cs, Fr, Be, Mg, Ca, Sr, Ba, Ra, Sc, Y, La, Ac, Ti, Zr, Hf, Unq, V, Nb, Ta, Unp, Cr, Mo, W, Unh, Mn, Tc, Re, Uns, Fe, Ru, Os, Co, Rh, Ir, Ni, Pd, Pt, Cu, Ag, Au, Zn, Cd, Hg, Al, Ga, In, Tl, Sn, Pb, Bi, any other element within the Lanthanide or Actinide series, and Si, Ge, As, Sb, Te, and Po. In one embodiment, the metals may be, for example, any combination of the metals encompassed by the present invention.

In another embodiment, the metals may be, for example, Pt, Au, Ag, Cu, Pd, Ni, or a combination thereof. In another embodiment, the metals may be, for example, Nb, Ta, Hf, Sc, Y, Al, or a combination thereof. In another embodiment, the metals may be, for example, Y, La, Ce, Pr, Nd, Pm, Sm, Eu, Gd, Tb, Dy, Ho, Er, Tm, Yb, Lu, or a combination thereof. In another embodiment, the metals may be, for example, Ac, Th, Pa, U, Np, Pu, Am, Cm, Bk, Cf, Es, Fm, Md, No, Lr, or a combination thereof. In another embodiment, the metals may be, for example, Li, Na, K, Rb, Cs, Fr, Be, Mg, Ca, Sr, Ba, Ra, or a combination thereof. In another embodiment, the metals may be, for example, Re, Rh, Ru, Ir, or a combination thereof. In another embodiment, the metals may be, for example, In, Sn, or a combination thereof. In yet another embodiment, the metals may be, for example, Pb, Bi, or a combination thereof.

In a preferred embodiment, the metals may be, for example, Ti, Zr, Mn, Pb, Pt, Au, Nb, Ta, Cr, Fe, Co, Ni, or a combination thereof. In a more preferred embodiment, the metals may be, for example, Co, Ni, Fe, or a combination thereof. In an even more preferred embodiment, the metals may be, for example, Ti, Zr, or a combination thereof. In a most preferred embodiment, the metal may be, for example, Ti.

The precursor of the present invention can be molecular, meaning that the precursors have not been subjected to appreciable hydrolysis. Hydrolysis becomes appreciable when the molecular precursor begins to form a sol, meaning that particles ("sol particles") have formed in the precursor as a result of hydrolysis. Hydrolysis can be controlled, for example, by limiting the water content and temperature of the precursor. The preferred method to obtain and maintain a molecular precursor is to keep the water content of the precursor low enough to avoid appreciable hydrolysis.

The precursor of the present invention can be a sol. The sol particles that form within the precursor through hydrolysis can be, for example, microparticles, nanoparticles, or a combination thereof.

The precursor of the present invention can comprise non-sol particles that did not form in the precursor as a result of hydrolysis. The non-sol particles are surrounded by at least one ligand and can be, for example, microparticles, nanoparticles, or a combination thereof. In one embodiment, the non-sol particles are ceramics. In another embodiment, the non-sol particles are alloys. In another embodiment, the non-sol particles can comprise a combination of alloys and ceramics.

In a further embodiment, the precursor can comprise sol particles and non-sol particles. Examples of how particles may be used with the present invention are included in U.S. Patent Application Pub. No. 2002/0018861 A1, which is hereby incorporated herein in its entirety by reference.

As noted above, the precursor preferably comprises at least one metal bound to at least one ligand. Generally, a ligand is used to make the precursor layer 101a stable, or at least metastable layer. The precursor layer 101 should be stable, or at least metastable, meaning that the precursor layer 101 must not uncontrollably decompose during processing or under process conditions. The stability of the precursor layer may depend on the oxidation state of the metal in the complex. For example, most Ni(0) complexes are known to be unstable in air while Ni(II) complexes are stable in air. Accordingly, the stability of a process for depositing Ni-based films in an air atmosphere could be controlled by using a Ni(II) complex rather than a Ni(0) complex.

In addition, the ligand is selected to preferably make the precursor layer 101 amorphous, since crystallinity within the precursor layer impedes diffusion of reaction byproducts created during exposure out of the precursor layer (e.g., volatile organic species that diffuse out of the precursor layer) and adversely hinders the resolution of the resulting pattern of metal-containing material. In addition, crystalline films tend to exhibit lower reaction quantum yields than amorphous films as a result of the restricted motion of groups within the crystal.

To provide such a stable or metastable amorphous precursor, the precursor may comprise one or more ligands or combination of ligands. For example, several different ligands may be attached to each metal atom to provide asymmetry within the precursor layer. Also, ligands with two or more stereoisomeric forms, such as racemic 2-ethylhexanoate, provide asymmetry within the precursor layer. The presence of several isomers within the precursor layer impairs crystallization without affecting the desired properties of the precursor layer. Additionally, a low polarity precursor with low intermolecular forces may be desirable and, as such, may preferably comprise ligands with peripheral organic groups. Specific examples of preferred ligands comprise the following structures:

β-diketones (for example, "acac" or 2,4-pentanedione and substituted acetylacetone), which comprise the general formula

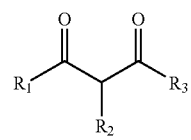

and their anionic forms;

γ-diketones (for example, 2,5-hexanedione and substituted acetonylacetone), which comprise the general formula

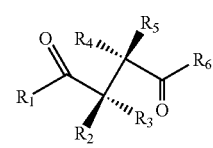

and their anionic forms;

dialkyldithiocarbamates, which comprise the general formula

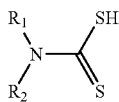

and their anionic forms;

carboxylic acids, which comprise the general formula

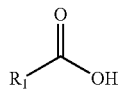

such as hexanoic acid where $R_1=CH_3(CH_2)_4$, and their anionic forms;

carboxylates, which comprise the general formula

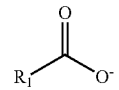

such as hexanoate where $R_1=CH_3(CH_2)_4$, and their anionic forms;

pyridine and/or substituted pyridines, which comprise the general formula

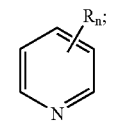

arsines, which comprise the general formula

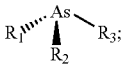

diarsines, which comprise the general formula

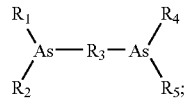

phosphines, which comprise the general formula

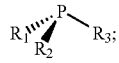

diphosphines, which comprise the general formula

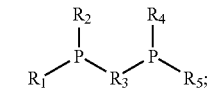

arenes, which comprise the general formula

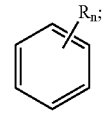

and other structures such as azide ($N_3^-$); amines, which comprise the general formula $NR_1R_2R_3$; diamines, which comprise the general formula $R_1R_2NR_3NR_4R_5$; hydroxy groups ($OH^-$); alkoxy ligands, which comprise the general formula $R_1O^-$; ligands such as $(C_2H_5)_2NCH_2CH_2O-$; alkyl and aryl ligands; or a combination thereof.

With respect to the above metal-ligand complexes or precursors, each functional group R within groups $R_1$ through $R_n$, wherein n represents the number of substitution sites, is independently selected from H, alkenyl, alkyl, aralkenyl, aralkyl, aryl, and various other groups as defined below:

The term "alkenyl" refers to a straight or branched hydrocarbon chain where at least one of the carbon-carbon linkages is a carbon-carbon double bond. The phrase straight chain or branched chain hydrocarbon chain means any substituted or unsubstituted acyclic carbon-containing compounds including alkanes, alkenes and alkynes.

The term "alkyl" refers to a straight or branched hydrocarbon chain. Examples of alkyl groups include lower alkyl, for example, methyl, ethyl, n-propyl, iso-propyl, n-butyl, iso-butyl, tert-butyl or iso-hexyl; upper alkyl, for example, n-heptyl, -octyl, iso-octyl, nonyl, decyl, and the like; lower alkylene, for example, ethylene, propylene, propylyne, butylene, butadiene, pentene, n-hexene or iso-hexene; and upper alkylene, for example, n-heptene, n-octene, iso-octene, nonene, decene and the like. Persons of ordinary skill in the art are familiar with numerous straight and branched alkyl groups, which are within the scope of the present invention. In addition, such alkyl groups may also contain various substituents in which one or more hydrogen atoms is replaced by a functional group or an in-chain functional group.

The term "aralkenyl" refers to an alkenyl group which is terminally substituted with at least one aryl group.

The term "aralkyl" refers to an alkyl group which is terminally substituted with at least one aryl group such as, for example, benzyl.

The term "aryl" refers to a hydrocarbon ring bearing a system of conjugated double bonds, often comprising at least six $\pi$ (pi) electrons. Examples of aryl groups include, but are not limited to, phenyl, naphthyl, anisyl, toluyl, xylenyl and the like.

As used herein, the term "functional group" refers to a chemical structure possessing in-chain, pendant and/or terminal functionality. Examples of in-chain functional groups include ethers, esters, ketones, amides, urethanes and their thio-derivatives (at least one oxygen atom is replaced by a sulfur atom). Examples of pendant and/or terminal functional groups include, but are not limited to, halogens such as fluorine and chlorine; hydrogen-containing groups such as hydroxy, alkoxy, epoxy, carboxyl, carbonyl, amino, amido, thio, isocyanato, cyano; and ethylenically unsaturated groups such as allyl, acryloyl and methacryloyl, and maleate and maleimido.

In a preferred embodiment, the precursor comprises at least one ligand selected to comprise one or more of the following structures and functional groups: acac, carboxylato, alkoxy, azides, amines, halides, carbonyl, nitrato, nitro, and any combination thereof including anionic forms. In addition, the precursor comprises at least one metal selected from the group consisting of Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, Mg, and any combination thereof.

As noted above, the precursor should be capable of being solubilized in a developer after being exposed to energy. For this conversion to occur, at least one ligand should be reactive. Upon exposure to energy, the precursor may undergo photochemical and/or photothermal reactions that produce intermediate products that are preferably unstable and capable of either spontaneously converting to the desired form or to volatile reaction byproducts that diffuse through and dissipate from the precursor layer. Accordingly, the desired photochemical and photothermal characteristics of the precursor can be enhanced by, for example, including ligands in the precursor that promote formation of the desired reaction products. An example of such ligands used to achieve the desired reaction products through photothermal reaction include, for example: acetylenes ($R_1CCR_2$); amines; aquo ($H_2O$); azides; β-diketones ($R_1(CO)CHR_2(CO)R_3$); γ-diketones ($R_1(CO)CR_2R_3CR_4R_5(CO)R_6$); carbonato ($CO_3^{-2}$); carbonyl (CO); cyano ($CN^-$); dihydride ($H_2$); ethylene($H_2CCH_2$) and substituted forms thereof ($R_1R_2CCR_3R_4$); halides; hydride ($H^-$); hydrogen; hydroxy (OH); isothiocyanato ($NCS^-$); nitrate ($NO_3$); nitrato ($NO_3^-$); nitrito ($NO_2^-$); nitro ($NO_2$); nitrosyl (NO); oxalato

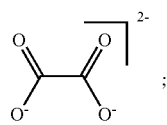

oxo ($O_2^-$); thiocarbonyl (CS); thiocyanato ($SCN^-$); and groups. Each functional group R within groups $R_1$ through $R_n$, wherein n represents the number of substituted atoms, is independently selected, and preferably, is independently selected from H, alkyl, aryl, alkenyl, aralkyl and aralkenyl groups. Even more preferably, each ligand is independently selected to comprise one or more of the following structures and functional groups: acac, oxalato, carboxylato, alkoxy, azides, amines, halides, carbonyl, nitrato, nitro groups and any combination thereof including anionic forms. It should be appreciated that such ligands may also be combined with other ligands, including those described previously. Other exemplary precursors, including metal-ligand complexes, are described in U.S. Pat. No. 5,534,312, which is hereby incorporated herein in its entirety by reference.

While the precursor 101 alone maybe applied to the substrate 102, the precursor may also be mixed with a casting solvent to solubilize the precursor for ease of application onto the substrate 102. The casting solvent may be chosen based on several criteria, including its environmental impact, reactivity and purity, wherein purity considerations include, but are not limited to, isomeric purity and the presence of metal ions. Other physical characteristics of the casting solvent may also be taken into account, including the solubility limit of the precursor, oxygen and other gases in the casting solvent; the viscosity and vapor pressure of the combined casting solvent and precursor; the ability of the casting solvent to diffuse through a subsequently formed film; and the thermal stability of the casting solvent. In addition, the spectral characteristics of the casting solvent are an important design consideration, because a casting solvent spectra that can easily be subtracted from a spectra of a precursor layer can facilitate identification of structural changes in the precursor layer. Knowledge of such structural changes aids in designing the process to achieve operational goals. Standard chemical spectral analyses used in identifying structural changes include, but are not limited to, V, visible, IR, NMR, electron beam, ion beam and x-ray spectroscopy techniques such as XPS and ESCA. Furthermore, a casting solvent's influence on secondary reactions such as the initiation of nucleation in a subsequently formed film should also be considered in selecting a casting solvent. Exemplary casting solvents include, but are not limited to, the alkanes, and in particular, the hexanes; the ketones, and in particular, methyl isobutyl ketone ("MIBK") and methyl ethyl ketone ("MEK"); and propylene glycol monomethyl ether acetate ("PGMEA").

The substrate 102 may be any material that is compatible with the precursor layer 101 such that the reactions required for pattern formation are not adversely affected, the metal-containing material can adhere to the substrate, and any differences in coefficients of expansion are sufficiently small to avoid product failure with normal variations in temperature. Examples of substrates that may be used include simple salts such as $CaF_2$; semiconductor surfaces including silicon; compound semiconductors including Group III–V materials such as gallium arsenide (GaAs), indium phosphide (InP), and gallium nitride (GaN); Group IV—IV materials such as silicon carbide (SiC); Group II–VI materials such as mercury cadmium telluride (HgCdTe, MCT), silicon germanium (SiGe), strained silicon, and silicon-on-insulator (SOI); and the integration of Group III–V materials with silicon. Other examples of substrates include printed and/or laminated circuit board substrates, metals, ceramics, glasses and flexible substrates which include, but are not limited to, plastics. Although plastics and other organic substrates provide certain advantages such as flexibility, the disadvantage of using plastics and other organic substrates is that they can be damaged by the relatively high process temperatures of conventional deposition methods. The relatively low process temperatures that may be used with the present invention such as, for example, ambient temperatures, are thus beneficial in the application of plastics and other organic substrates.

It should be appreciated that the choice of substrate is not critical to the process but may affect other design considerations such as the choice of casting solvent and method of applying the precursor. For example, the substrate may have been coated with single or multiple layers, such as dielectric layers, photoresist, polyimide, metal-oxides, thermal oxides, conductive materials, insulating materials, ferroelectric materials or other materials used in the construction of electronic devices. As such, the substrate may require preparation prior to applying the precursor. Substrate preparations include, for example, a simple cleaning of the surface of the substrate, applying a barrier material, applying an adhesion promoting material, applying a reactive material such as a coupling agent, and a combination thereof.

Methods of applying the precursor 101 to the substrate 102 may include, for example, spinning, spraying, dipping, roller coating, stamping, meniscus coating, and various inking approaches such as inkjet-type application. Preferably, a precursor solution is applied by spinning or spraying methods. The variables in the process of applying the precursor may be altered to control the properties of the precursor layer. Examples of such properties are, for example, the thickness, smoothness and uniformity of the precursor layer. Control of process variables can, for example, minimize the formation of edge effects, voids and pinholes in the film; and reduce the amount of precursor used. For example, the concentration of the precursor in the casting solvent can be varied over a wide range, and chemical additives can be added, to control properties such as, for example, photosensitivity, viscosity, uniformity, rate of precursor layer formation and resistance of the precursor layer to cracking during conversion.

In a second step, predetermined portions of the precursor layer 101 are exposed to exposure energy 105 in order to produce an exposed precursor layer 107 having both exposed regions 107a and unexposed regions 107b, wherein the exposed regions 107a correspond to the predetermined portions of the precursor layer 101 that were exposed to exposure energy 105. The exposure of such predetermined portions of the precursor layer 101 results in those portions being converted to exposed regions 107a and to a form that is more soluble in a developer such that these exposed regions 107a can be removed in a subsequent developing step.

Any form of energy capable of converting the precursor layer by photochemical reaction, photothermal reaction, or a combination thereof, may be used in this exposure step. Examples of energy capable of converting the precursor layer in this manner include, for example, heat, electromagnetic radiation, electron beam, ion or charged particle beam, neutral-atom beam, and chemical energy. In one embodiment, the energy may include heat, electromagnetic radiation, electron beam, ion or charged particle beam, neutral-atom beam, chemical, or a combination thereof. In another embodiment, electromagnetic radiation may be used, including light, which can be broadband or in specific wavelengths. In a preferred embodiment the light is ultraviolet light including, but not limited to, light in the wavelength range of from about 150 nm to about 600 nm and, most preferably, the wavelength range of from about 157 nm to about 436 nm.

The predetermined portions of the precursor layer 101 are selectively exposed to energy 105 using any means. As illustrated in FIG. 1, a mask 106 is used to permit the exposure energy 105 to strike only the predetermined portions. Other means of directing energy to predetermined portions include, for example, a collimation apparatus, a laser diode or a reflector system.

While a sufficient amount of exposure energy 105 needs to be used to ensure that the exposed regions 107a are sufficiently converted to a form that can be solubilized by a developer and removed, conversion should be controlled to prevent over-conversion. Too much conversion can result in the creation of an insoluble extended-solid/extended-oxide network in the predetermined portion of precursor layer 107 that is difficult, if not impossible, to develop. It should be appreciated that during exposure and conversion that portions of the unexposed regions 107b may be partially converted. However, as discussed below, the developer to solubilized and remove exposed regions 107a is selected such that solubilization of those portions of the unexposed regions 107b that are only partially converted is minimized. In a most preferred embodiment, the energy does not exceed the glass-transition temperature of most desired substrates.

Alternatively, it should be appreciated that the total energy necessary for conversion of the predetermined portions of the precursor layer can optionally be applied in a step-wise manner. Such step-wise conversion can save on equipment cost, increase equipment life, reduce energy consumption, and increase the amount of product produced. In sum, step-wise application of energy can produce more product at a lower cost. Such a step-wise process may also be used to remove any remaining casting solvent after application of the precursor to the substrate. In this case, the application of energy would be applied to keep the temperature below the thermal decomposition temperature of the precursor layer. Furthermore, multi-component precursors can be designed to facilitate step-wise conversions. Methods of step-wise conversion are described in U.S. Pat. Appl. Publ. No. US2002/0037481 A1, which is hereby incorporated herein in its entirety by reference.

The atmosphere in which the exposure or energy or conversion of the precursor layer is conducted may also be controlled depending upon the desired patterned film to be produced. For example, air may be used as the atmosphere for conversion since it is economical. However, air may not be suitable for all precursors or end uses of the patterned film. For example, the presence of an oxidizing environment, for example, an environment comprising oxygen, may be preferred if the patterned film is to comprise metal oxides. However, the presence of a reducing environment, for example, an environment comprising nitrogen or hydrogen, may be preferred if the precursor layer is to comprise reduced metals as opposed to metal oxides. Alternatively, a vacuum or inert environment may be used for processing. It may also be desirable to control the humidity of the atmosphere to regulate the amount of water in the precursor layer.

It should be appreciated that the atmosphere in which the conversion is performed may affect the composition of the converted precursor. More specifically, the atmosphere may affect the polarity of the exposed precursor, which, as will be discussed below, affects the selection of the developer. Basically, a developer is selected to solubilize the exposed precursor, and obtaining the requisite solubility may require, inter alia, that the developer's polarity and the polarity of the exposed precursor be appropriately matched to allow for such solubilization. Therefore, control of the atmosphere may be done in conjunction with the selection and use of a particular developer.

The precursor layer 101 may also be optionally pre-exposed prior to full exposure as described above. As illustrated in FIG. 1, wherein the dashed lines represent an optional step, the entire precursor layer 101 may be pre-exposed to pre-exposure energy 103, wherein pre-exposure energy 103 comes from a source of energy that is cheaper to purchase and operate relative to, for example, a source of energy for full exposure or the single step exposure described above. An example of a cheaper source of energy is an ultraviolet lamp. Pre-exposure to pre-exposure energy 103 partially converts the precursor layer 101 into a partially-converted precursor layer 104. Predetermined portions of this partially-converted precursor layer 104 are then exposed as described above to produce exposed regions 107a and unexposed regions 107b. In this case, less energy 105 is needed, and for a relatively shorter period of time, for exposure of the predetermined portions.

It should also be appreciated that depending upon the amount and types of energy used and the temperature of conversion, structural changes may occur to the precursor. For example, pre-exposing the precursor not only reduces the dose of exposing energy 105 required but also partially converts the precursor layer. As such, pre-exposure can alter properties of the precursor layer such as conductivity, nucleation, speciation, and crystallization, as well as anneal the precursor layer for uniformity. Therefore, controlling the extent of conversion and the products formed by conversion can provide further flexibility to the process. In one embodiment, the precursor material can be removed in steps or plated using methods known by those of skill in the art. In one example, partially converted areas may serve as nucleation sites for plating to allow for the addition of other materials. In another example, the patterned film of metal-containing material can be used as a mask for implantation to selectively add other materials to an underlying material. Examples of how masks may be used with the present invention are included in U.S. Patent Application Pub. No. 2002/0076495 A1, and U.S. Pat. No. 5,534,312, each of which are hereby incorporated herein in their entirety by reference.

In a third step, the exposed regions 107a are developed, which includes solubilizing and removing these exposed regions 107a using a developer, to produce a patterned precursor layer or patterned film 108, which comprises the unexposed regions 107b that remain on the substrate 102. Specifically, the developer is chosen to selectively solubilize and, thus, selectively develop the portions of precursor layer 101 that were exposed to a sufficient amount of exposure energy 105. Selective development refers to the use of a developer that selectively removes the exposed regions 107a of the precursor layer 107 to a much greater degree than the unexposed regions 107b that were not exposed to exposure energy 105 and, therefore, are either unconverted or only partially converted. The developer will preferably remove the predetermined portions of precursor layer 107 rapidly without affecting the unexposed regions 107b or any partially-converted portions thereof, or at least minimizing removal of such areas beyond an even removal or thinning of such areas. The removal of the exposed region is either complete, such that no converted material remains, or substantially complete, such that any remaining converted material does not create an intolerable effect on the performance of the patterned precursor layer 108.

The developer should be chosen to maximize development selectivity. One of skill in the art has access to a vast amount of scientific literature and data regarding the solubility of metal-organic compounds and will appreciate that the choice of developer depends upon the nature of both the exposed and unexposed regions 107a, 107b. Furthermore, one of skill in the art will appreciate that the choice of developer may begin empirically by calculating the Gibb's free energy of dissolution using available thermodynamic data. It is also recognized that the kinetics of dissolution will be important in selecting the developer.

Further, developers may be identified and selected by exposing unconverted precursor layers to different levels of energy, different types of energy, and a combination thereof; and using standard techniques to identify changes in structure and physical properties of the precursor layer during conversion. For example, spectral analysis can be used to identify functional group changes in the molecular structure. Using knowledge of these structural changes potential developers can be evaluated and selected. For example, if the exposure regions comprise an amorphous metal-oxide produced as a result of conducting exposure in air, and the unexposed regions are not oxides, then the exposed regions would be soluble in polar solvents and the unexposed regions would be soluble in non-polar aprotic solvents such as hexane, hexenes, methylene chloride, chlorinated solvents, MIBK, ketones, esters and ethers. Therefore, high polarity solvents may be identified as potential developers for this type of precursor. One of skill in the art would appreciate that the experimental method just described could include a variety of other criteria such as cost of consumables, chemical storage considerations, and the safety of the process to the environment and operators.

It should be appreciated that the choice and relative effectiveness of the developer will depend on process conditions used during conversion such as the type of precursor; the type and amount of exposure and pre-exposure energies 105, 103 used for converting the precursor layer 101; and the temperature and the atmosphere in which conversion takes place. Generally, these factors affect the polarity of the precursor upon conversion, which, in turn, drives the selection of a developer for a given precursor since the polarity of the exposed precursor is a factor in determining whether it is soluble in a particular developer.

The choice of developer can depend on the type of precursor applied to the substrate, because the molecular interactions within a precursor can vary according to the type of precursor. For example, it is recognized that when a film is formed, a precursor may associate within the film, typically through bridging ligands. In one example, the molecules within a molecular precursor can associate through bridging ligands other than $O_{2-}$ ions such as, for example, $CO_2$. In another example, the molecules within a sol precursor can form associations between metals through bridging $O_2^-$ ions and, accordingly, can form a gel. These molecular interactions can be initiated, accelerated, or disrupted in subsequent process steps such as, for example, pre-exposure, exposure and post-exposure of the precursor layer, thus affecting the relative compositions of the converted and unconverted precursor materials and, accordingly, the choice of developer.

As noted above, the atmosphere in which conversion takes place affects polarity of the exposed precursor and, thus, should be selected accordingly. Also, depending upon the amount and type of energy used and the temperature, conversion may result in the production of non-polar organic fragments in the precursor layer. In this case, potential developers would not include higher polarity solvents such as water, but rather, would include lower polarity solvents such as, for example, long-chain or branched-chain alcohols.

Generally, the developer comprises a polar or non-polar solvent that will solubilize an exposed precursor. The developer may be a polar or protic solvent such as water, alcohol, or a weak acid, or the developer may be a non-polar solvent such as an alkane. In another embodiment, the developer comprises an amphiphilic solvent containing both polar and non-polar functionality.

Casting solvents may also be used as developers. For example, the unconverted precursor layer may oligomerize or polymerize during coating and change the kinetics of dissolution of the unconverted material such that the solubility of the unconverted material in the casting solvent has decreased significantly. Exposure of the precursor layer to energy may then break weak polymeric bonds and create smaller fragments in the converted regions of the film that are soluble in the casting solvent. Although the polarity of the exposed and unexposed regions may be similar, the kinetics of dissolution may favor removal of the shorter fragments in the exposed regions. Accordingly, these shorter fragments may surprisingly be best removed with a casting solvent. It should be appreciated that a casting solvent may also be used in a mixture with other developers.

Although developers can be in the form of a liquid or a solution, dry development methods that are analogous to dry patterning may also be used. Preferred methods of development include spray, puddle, and immersion application techniques. Furthermore, preferred methods of development are not harmful to persons operating the equipment and are safe for the environment.

Lastly, the patterned film 108 may optionally be exposed to post-exposing energy 109 in a post exposure step to further alter the physical properties of patterned film 108. As with the pre-exposing and exposing steps described above, the properties of patterned film 108 can be altered by photochemical reactions, photothermal reactions, or combinations thereof. Such post-exposure may be performed for many reasons. For example, thermal, laser or plasma energy may be used to anneal the patterned film 108 or, in other words, to change the patterned film 108 from an amorphous material to a semi-crystalline material or crystalline material. Accordingly, the physical properties of the patterned film 108 may be finely-tuned by post-exposing energy 109 for a particular end-use.

The invention having been described above, the following Examples are presented to illustrate rather than limit the scope of the invention:

EXAMPLE 1

Titanium (IV) diisopropoxide bis(ethyl acetoacetate), otherwise identified by the chemical formual $Ti(Pr^iO)_2(EAA)_2$, was synthesized by dissolving 2.9410 g titanium (IV) isopropoxide (97%, Aldrich) in 2.0100 g isopropanol to form a solution. A sample of 2.6213 g ethyl acetoacetate (99%, Aldrich) was added to the solution, and the solution was stirred for 2 hours at room temperature. Volatiles were allowed to evaporate from the resulting mixture at room temperature, and the product $Ti(Pr^iO)_2(EAA)_2$ was a sticky orange liquid.

A sample of 0.1017 g $Ti(Pr^iO)_2(EAA)_2$ was dissolved in 0.3132 g methyl isobutyl ketone, otherwise known as MIBK, to make a precursor solution. A precursor film was formed on a silicon substrate by spin-coating. The film was exposed to UV radiation with a wavelength of 254 nm through a mask for 5 minutes to form a predetermined pattern of exposed regions. After dipping the coated substrate in hexanes and drying the film with compressed air, the film was developed using isopropanol as the developer. The developer removed the predetermined pattern of exposed regions to create the positive pattern of unexposed material.

EXAMPLE 2

The extent of exposure was tested by repeating the process in Example 1 using exposure times of 2, 3, 5, 7 and 12 minutes. As the exposure time increased, the exposed region became more difficult to remove with the developer, and the material that was converted using 12 minutes of exposure time was no longer soluble in the developer. As such, exposure time was found to be an important variable such that too much exposure will result in a negative lithographic image rather than the positive lithographic image. Thus, the desired pattern will not be obtainable with too much exposure since the converted material will no longer be soluble in the developer.

EXAMPLE 3

The process of Example 1 was repeated using hexanes as the casting solvent and acetone as the developer. A positive pattern was successfully obtained.

It was observed that $Ti(Pr^iO)_2(EAA)_2$ could be dissolved in both polar and nonpolar casting solvents. Application of $Ti(Pr^iO)_2(EAA)_2$ using a polar casting solvent resulted in sticky and dirty films, whereas the use of a nonpolar casting solvent resulted in clean and dry films.

The use of polar casting solvents such as acetone and MIBK resulted in precursor films that could only be slightly redissolved by nonpolar solvents such as hexanes. Likewise, the use of nonpolar solvents as casting solvents resulted in precursor films that could only be slightly redissolved by polar solvents.

EXAMPLE 4

A titanium-containing precursor was synthesized by dissolving 0.2937 g titanium (IV) isopropoxide in 2.1093 g ethanol to form a solution. A sample of 0.2258 g lactic acid was added to the solution to make a precursor solution. After allowing 24 hours for the precursor solution to stabilize, a titanium precursor film was formed by spin-coating the precursor solution on a silicon substrate. A predetermined portion of the film was exposed to the output of a low pressure mercury lamp using exposure times of 0.5, 1, 2, 3, 4, 5, 7 and 10 minutes. Developing the film with acetone gave a positive pattern with each exposure time, and at an exposure time of 1 minute, the unexposed region of the film was largely unaffected by development. Developing the film with ethanol, however, removed the unexposed regions and, thus, produced a negative image.

EXAMPLE 5

An important feature of the invention is the ability to obtain highly resolved patterns. The process of Example 1 was repeated using iron tetracarbonyl triphenylphosphine, otherwise identified by the chemical formula $Fe(CO)_4PPh_3$, and the casting solvent was methylene chloride. The sample was exposed to the output of a low pressure mercury lamp for 30 minutes through a chromium optical mask to form the predetermined pattern. The exposed region was developed by immersing the sample in water. The water removed the predetermined pattern of exposed regions to create a positive pattern with a feature size of 4 microns.

EXAMPLE 6

A sample of Mn(II) 2-ethylhexanoate, otherwise identified by the chemical formula $Mn(II)(CH_3(CH_2)_3CH(C_2H_5)COO)_2$, was dissolved in hexanes to make a precursor solution. A precursor film was formed on a silicon substrate by spin-coating. The film was exposed to UV radiation under a Mineralite lamp for 17 hours to form a predetermined pattern. The film was developed using water as the developer. The developer removed the exposed regions to create the positive pattern. The positive pattern could then be further converted to a film containing manganese oxide using a post-exposure dose of thermal or photochemical energy.

EXAMPLE 7

A sample of tungsten pentacarbonyl triphenylphosphine, otherwise identified by the chemical formula $W(CO)_5PPh_3$, was dissolved in methylene chloride to make a precursor solution. A precursor film was formed on a silicon substrate by spin-coating. The film was exposed to UV radiation under a Mineralite lamp for 17 hours to form a predetermined pattern. The film was developed using water as the developer. The developer removed the exposed regions to create the positive pattern. The positive pattern could then be further converted to a film containing tungsten oxide using a post-exposure dose of thermal or photochemical energy.

EXAMPLE 8

A sample of Ni(II) 2-ethylhexanoate, otherwise identified by the chemical formula Ni(II)(CH$_3$(CH$_2$)$_3$CH(C$_2$H$_5$)COO)$_2$, was dissolved in MIBK to make a precursor solution. A precursor film was formed on a silicon substrate by spin-coating. The film was exposed to UV radiation under a Mineralite lamp for 22 hours to form a predetermined pattern. The film was developed using water as the developer. The developer removed the exposed regions to create the positive pattern. The positive pattern could then be further converted to a film containing nickel oxide using a post-exposure dose of thermal or photochemical energy.

EXAMPLE 9

A sample of Silver (I) trifluoroacetylacetonate, otherwise identified by the chemical formulas Ag(I)(CH$_3$(CO)CH(CO)CF$_3$) and Ag(I)(tfacac), was dissolved in 1.0059 g anhydrous ethanol to make a precursor solution. A precursor film was formed on a silicon substrate by spin-coating. The film was exposed to UV radiation with a wavelength of 254 nm through a mask for 12 minutes to form a predetermined pattern of exposed regions. The sample was left in the dark for 80 minutes, and silver oxide formed in the unexposed regions of the film. Developing the film with cyclohexanol for 20 seconds gave a positive pattern.

EXAMPLE 10

A mixture of precursors was formed by first dissolving 0.0516 g titanium (IV) diisopropoxide bis(2,4-pentanedionate) in 0.5002 g MIBK and adding 0.0464 g titanium (IV) diisopropoxide bis(ethyl acetoacetate) to make the mixed precursor solution.

Figure 2:
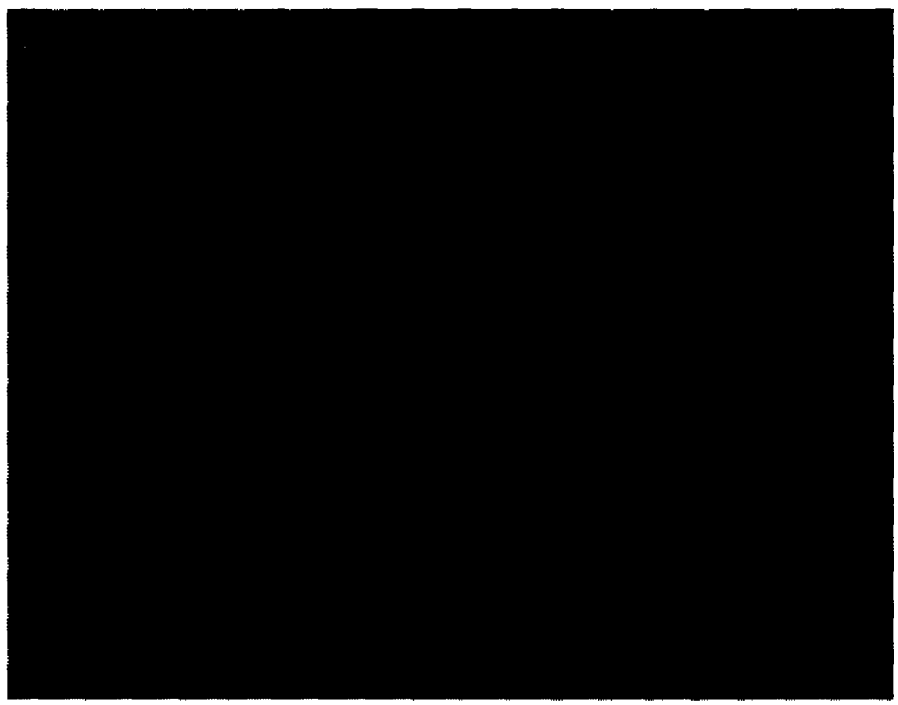
FIG. 2 is an image of a pattern of titanium-containing material (dark area) showing pattern resolution by displaying reference numbers that are 100 microns in height.

A precursor film was formed on a silicon substrate by spin-coating. The film was exposed to the output of a low pressure mercury lamp in a predetermined pattern formed by transmitting the output through a mask placed on the film. Exposure times of 4, 4.5, 7.5, 8 and 9 minutes were used. Developing the film with water gave a positive pattern with each exposure time. The resolution of the pattern of titanium-containing material is shown in FIG. 2 by displaying reference numbers that are 100 microns in height. The dark area in FIG. 2 is the patterned film and the light area, which was the exposed region, is the silicon substrate.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. The presently disclosed embodiments are therefore to be considered in all respects as illustrative and not restrictive, the scope of the invention being indicated by the appended claims, and not limited to the foregoing description.

For example, although the invention has been described using a film comprising a metal organic complex containing titanium, it is to be understood that other metals or combinations of metals may be used. Moreover, although the invention has been described as using certain casting solvents and developers, it is to be understood that other casting solvents and developers may be used. For example, both water and isopropanol have been described as developers but one of skill in the art would recognize other developers may be equally effective or more preferred due to other process considerations.

What is claimed is:

1. A method for forming a pattern on a substrate, comprising:
    applying a precursor comprising at least one metal to a substrate to form a precursor layer;
    exposing a predetermined portion of the precursor layer; and
    developing the predetermined portion of the precursor layer, thereby at least substantially removing the predetermined portion from the substrate and forming a pattern on the substrate comprising a remaining portion of the precursor.

2. The method of claim 1, wherein the precursor comprises a molecular precursor.

3. The method of claim 1, wherein the precursor comprises particles chemically bound to at least one ligand.

4. The method of claim 1, wherein the precursor comprises Ti(Pr$^i$O)$_2$(EAA)$_2$.

5. The method of claim 1, wherein said exposing comprises photochemically reacting, photothermally reacting and combinations thereof.

6. The method of claim 1, wherein said exposing comprises radiating the predetermined portion of the precursor layer with electromagnetic radiation.

7. The method of claim 1, wherein the electromagnetic radiation comprises ultraviolet radiation.

8. The method of claim 1, wherein said developing comprises contacting the first predetermined portion with a polar solvent.

9. The method of claim 1, wherein said developing comprises contacting the first predetermined portion with a protic solvent.

10. The method of claim 1 further comprising:
    exposing a second predetermined portion of the precursor layer; and
    developing the second predetermined portion of the precursor layer, thereby at least substantially removing the second predetermined portion from the substrate and forming a second pattern on the substrate comprising a second remaining portion of the precursor.

11. The method of claim 1, further comprising pre-exposing the precursor layer to energy before said exposing.

12. The method of claim 1 further comprising post-exposing the precursor to energy after said exposing step. to energy before said exposing.

13. The method of claim 2, wherein the precursor further comprises particles chemically bound to least one ligand.

14. The method of claim 3, wherein the particles comprise sol particles.

15. The method of claim 3, wherein the particles comprise microparticles.

16. The method of claim 3, wherein the particles comprise nanoparticles.

17. The method of claim 3, wherein the particles comprise ceramics.

18. The method of claim 3, wherein the particles comprise alloys.

19. The method of claim 14, further comprising transforming the precursor into a gel.

20. The method of claim 11, wherein said pre-exposing comprises photochemically reacting, photothermally reacting and combinations thereof.

21. The method of claim 11, wherein the pre-exposing comprises radiating the predetermined portion of the precursor layer with electromagnetic radiation.

22. The method of claim 11, wherein the electromagnetic radiation comprises ultraviolet radiation.

23. The method of claim 11, wherein the pre-exposing further comprises selecting a predetermined fraction of a minimum energy necessary for developing the predetermined portion of the precursor.

24. The method of claim 11, further comprising post-exposing the precursor to energy after said exposing step.

25. The method of claims 24 or 12, wherein said post-exposing comprises photochemically reacting, photothermally reacting and combinations thereof.

26. The method of claims 24 or 12, wherein the post-exposing comprises radiating the predetermined portion of the precursor layer with electromagnetic radiation.

27. The method of claim 24 or 12, wherein the electromagnetic radiation comprises ultraviolet radiation.

28. An electronic component formed by a process comprising:
   applying a precursor comprising at least one metal to a substrate to form a precursor layer;
   exposing a predetermined portion of the precursor layer; and
   developing the predetermined portion of the precursor layer, thereby at least substantially removing the predetermined portion from the substrate and forming a pattern on the substrate comprising a remaining portion of the precursor.

29. The electronic component of claim 28, wherein the precursor comprises a molecular precursor.

30. The electronic component of claim 28, wherein the precursor comprises particles chemically bound to at least one ligand.

31. The electronic component of claim 28, wherein the process further comprises pre-exposing the precursor to energy before said exposing.

32. The electronic component of claim 28, wherein the process further comprises post-exposing the precursor to energy after said exposing.

33. The method of claim 29, wherein the precursor further comprises particles chemically bound to least one ligand.

34. The electronic component of claim 30, wherein the particles comprise sol particles.

35. The electronic component of claim 30, wherein the particles comprise microparticles.

36. The electronic component of claim 30, wherein the particles comprise nanoparticles.

37. The electronic component of claim 30, wherein the particles comprise ceramics.

38. The electronic component of claim 30, wherein said particles comprise alloys.

39. The electronic component of claim 34, further comprising transforming the precursor into a gel.

40. The electronic component of claim 31, wherein the process further comprises post-exposing the precursor to energy after said exposing.

41. A precursor comprising:
   a metal-containing material comprising $Ti(Pr^iO)_2(EAA)_2$ or any isomer thereof; and
   a casting solvent.

42. A film of material comprising $Ti(Pr^iO)_2(EAA)_2$ or any isomer thereof.

43. An electronic component comprising:
   a substrate; and
   a metal-containing material comprising $Ti(Pr^iO)_2(EAA)_2$ or an isomer thereof applied to said substrate.

* * * * *